United States Patent [19]

Duvvury et al.

[11] Patent Number: 5,604,369
[45] Date of Patent: Feb. 18, 1997

[54] ESD PROTECTION DEVICE FOR HIGH VOLTAGE CMOS APPLICATIONS

[75] Inventors: Charvaka Duvvury, Plano; Roy C. Jones, III, Dallas, both of Tex.

[73] Assignee: Texas Instruments Incorporated, Dallas, Tex.

[21] Appl. No.: 397,004

[22] Filed: Mar. 1, 1995

[51] Int. Cl.$^6$ .................................................. H01L 23/62
[52] U.S. Cl. .......................... 257/360; 257/361; 257/363
[58] Field of Search ...................................... 257/358, 359, 257/360, 361, 363

[56] References Cited

U.S. PATENT DOCUMENTS

| | | |
|---|---|---|
| 4,527,213 | 7/1985 | Ariizumi . |
| 4,602,267 | 7/1986 | Shirato . |
| 4,734,752 | 3/1988 | Liu et al. . |
| 4,786,956 | 11/1988 | Puar . |
| 5,158,899 | 10/1992 | Yamagata ................................ 437/27 |
| 5,208,474 | 5/1993 | Yamagata et al. ...................... 257/356 |
| 5,225,702 | 7/1993 | Chatterjee ............................... 257/360 |
| 5,406,105 | 4/1995 | Lee ........................................... 257/355 |

FOREIGN PATENT DOCUMENTS

| | | | |
|---|---|---|---|
| 59-231847 | 12/1984 | Japan | ................................... 257/360 |
| 1-10657 | 1/1989 | Japan | ................................... 257/360 |

*Primary Examiner*—Ngân V. Ngô
*Attorney, Agent, or Firm*—Mark A. Valetti; Jim Brady, III; Richard L. Donaldson

[57] ABSTRACT

A protection device, circuit, and a method of forming the same. A field oxide drain extended nMOS (FODENMOS) transistor (10) is located in an epitaxial region (16). The FODENMOS transistor (10) comprises a field oxide region (36a) that extends from the source diffused regions (22) to over a portion of the extended drain region (20). A drain diffused region (24) is located within the extended drain region (20). A gate electrode (40) may be located above the field oxide region (36a) if desired. Accordingly, there is no thin oxide interface between the gate electrode (40) and the extended drain region (20) that can lead to low ESD protection.

6 Claims, 1 Drawing Sheet

ESD PROTECTION DEVICE FOR HIGH VOLTAGE CMOS APPLICATIONS

FIELD OF THE INVENTION

This invention generally relates to high voltage CMOS devices and more specifically to ESD protection in high voltage CMOS devices.

BACKGROUND OF THE INVENTION

Current technology trends continue to focus on high performance CMOS (complementary metal-oxide-semiconductor) and a new arena of VLSI (very-large-scale integration) called Smart Power chips is being developed. Smart Power chips are built with both low and high voltage CMOS. Power transistors on these Smart Power chips typically allow operating voltages up to 50 volts. The thrust of current research focuses on improving the transistor performance.

Smart Power chips are widely used in the automotive industry. The automotive environment is harsh and requires relatively high levels of protection against ESD and other types of transients. However, power transistors are generally weak for ESD due to their inherent device structure. Good ESD performance actually requires low power dissipation capability under high currents (i.e., avalanche conditions). This is inherent in optimized nMOS transistor structures, but not in power transistors due to the fact that the holding voltages under avalanche conditions are quite high. A high holding voltage increases the relative power dissipation under an ESD event and results in a low self-protection level.

A prior-art power transistor, a drain-extended NMOS (DENMOS), is shown in FIG. 1. The DENMOS is built on a p-type epitaxial substrate 110. The drain 116 is formed in a n-well 114 (an extended drain region). The source 118 is formed directly in the p-tank 112. The gate 120 is located partially over the p-tank and partially over a field oxide region 122 that is located between the drain 116 and the source 118. A 500 Å gate oxide 121 is located between the gate 120 and the p-tank 112. Typical channel lengths (between the source 118 edge and the n-well 114 edge) are 3–8 µm. Smaller than 3 µm channel lengths are not used because the breakdown voltage (BVdss) would be lowered for high voltage applications. Under an ESD event, a high electric field occurs at the extended drain 114 and the gate oxide 112 interface. This can lead to localized breakdown of the junction and low ESD protection level.

SUMMARY OF THE INVENTION

A protection device having improved built-in ESD protection is disclosed herein. A field oxide drain extended nMOS (FODENMOS) transistor comprises a source diffused region located in a tank region and a drain diffused region located in an extended drain region. A field oxide region extends from the source diffused region to over a portion of the extended drain region. A gate electrode may be located above the field oxide region if desired. Accordingly, there is no interface between a thin gate oxide and the extended drain region that can lead to low ESD protection. If desired, the FODENMOS may serve as a primary ESD protection device and be combined with a conventional DENMOS for more complete protection.

An advantage of the invention is providing an integrated protection device for power MOSFETs.

A further advantage of the invention is providing a protection device that is compatible with current semiconductor processing and requires no addition masking or other process steps.

A further advantage of the invention is providing a protection device that meets the requirements of the automotive and other high voltage environments.

These and other advantages will be apparent to those skilled in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION

The invention will be described in conjunction with a ESD protection for a power device such as a Smart Power Integrated Circuit (IC). The benefits of the invention may also be realized in other high voltage applications such as high voltage power supplies. For Smart Power ICs, high performance 5 V or 3.3 V CMOS circuits must be combined with high voltage (typically up to 40 V) power transistors. High voltage power transistors may be used, for example, in the output drivers of a Smart Power IC. Smart Power ICs are typically used in the automotive environment. The applications of these ICs in the harsh automotive environment demand robust ESD protection levels. Typically, a 4 kV ESD protection level is required.

Figure 1:
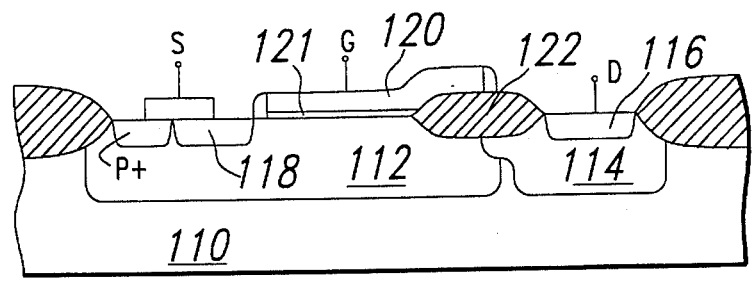
FIG. 1 is a cross-sectional view of a prior art DENMOS power transistor.
Figure 3:
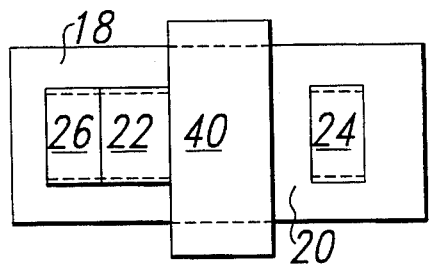
FIG. 3 is a layout of the power device of FIG. 2.
Figure 2:
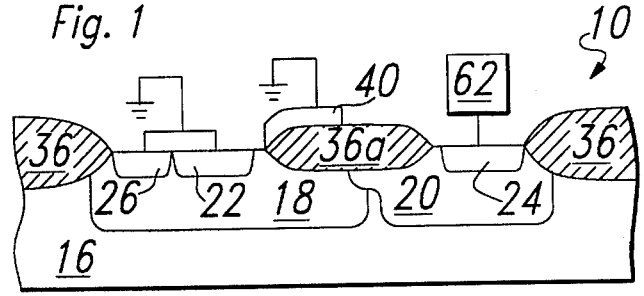
FIG. 2 is a cross-sectional view of a power device having built-in ESD robustness according to the invention.

A field oxide DENMOS (FODENMOS) 10 having built-in ESD robustness according to the invention is shown in FIGS. 2 and 3. Device 10 is located on a p-type epitaxial layer or substrate 16. A n-well region (extended drain region 20) is located adjacent a p-tank 18. Drain region 24 of DENMOS 10 is a n-type implanted and diffused region located within extended drain region 20. Breakdown is supported by n-well 20 to p-tank 18. The n-well 20 overlap of drain region 24 is set so that drain region 24 to p-tank 18 breakdown will not occur. Source region 22 is also a n-type diffused region. Source region 22 is located within p-tank 18 spaced apart from extended drain region 20. Source region 22 is shorted to p-tank 18 via a connection to p-type diffused region 26. It should be noted however that region 26 may be omitted due to the p-type epitaxial layer/substrate 16. A field oxide channel region 21 is formed between source region 22 and extended drain region 20.

Field oxide regions 36 and reverse biased junctions separate device 10 from other devices (not shown). Field oxide region 36a separates the drain 24 of FODENMOS 10 from source region 22. Field oxide region 36a is different from those found in prior art DENMOS devices because it extends the entire distance from source region 22 to over a portion of extended drain region 20 including over channel region 21.

Gate 40 is entirely located on field oxide region 36a. Gate 40 preferably comprises polysilicon but may alternatively comprise a metal. It should be noted that gate 40 is not necessary but is preferred because it provides better control of the device operating characteristics. Because there is no thin gate oxide region separating the gate from the extended drain region 20, a high electric field at the surface of the device is eliminated and the breakdown of the device 10 is controlled by the planar junction. Thus, the ESD current is forced towards bulk conduction and a breakdown voltage on the order of 60–70 voltage is achieved. (This is 10–20 volts higher than typical DENMOS structures.)

The thickness of field oxide region 36a need only be thick enough to accomplish forcing the ESD current towards bulk conduction. Accordingly, the thickness of field oxide region 36a may be the same as conventional field oxide regions (i.e., on the order of 6500 Å for a polysilicon gate or on the order of 10500 Å for a metal gate).

For ESD protection, drain region 24 may be connected to a bond pad 62. Source region is then preferably connected to ground. The gate 40 is also preferably connected to ground. Upon an ESD event, the voltage at bond pad 62 rises until it reaches the breakdown voltage of FODENMOS 10 (e.g. on the order of 60–70 volts). FODENMOS triggers as a lateral npn, dissipating the ESD event to ground. Because gate 40 is separated from the channel region by field oxide region 36a, no high electric field forms at the surface of the channel region and a higher ESD event can be handled before the device 10 becomes damaged.

A method for the formation of FODENMOS 10 into a p-type epitaxial layer 16 having a pad oxide 50 at the surface thereof will now be described. The process is similar to that described in U.S. Pat. No. 5,242,841, issued Sep. 7, 1993, assigned to Texas Instruments, Inc and hereby incorporated by reference.

Figure 4A:
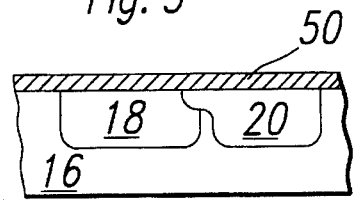
FIGS. 4a–e are cross-sectional views of various fabrication steps in the formation of the power device of FIG. 2.

Referring to FIG. 4a, extended drain region 20 and p-tank 18 are formed in p-type epitaxial layer 16. Extended drain region 20 may be formed by implantation and diffusion of an n-type dopant such as phosphorus and/or arsenic. The dopant concentration and depth of extended drain region 20 may vary by design, but may typically be on the order of $1\times10^{16}/cm^3$ and 1–3 μm, respectively. P-tank 18 is formed by implantation and diffusion of a p-type dopant such as boron. The dopant concentration and depth of p-tank 18 may vary by design, but may typically be on the order of $1\times10^{16}/cm^3$ and 1–3 μm, respectively. Of course, both extended drain region 20 and p-tank 18 may be diffused simultaneously if desired.

Figure 4B:
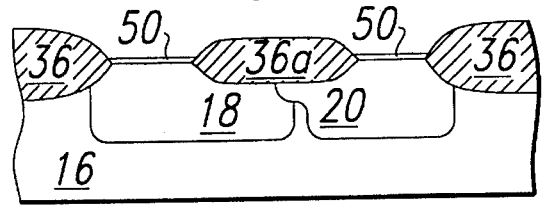

Next, field oxide regions 36 are formed at the surface of the structure as shown in FIG. 4b. Methods for forming field oxide regions are well known in the art. One method for forming field oxide regions 36 is described in U.S. Pat. No. 4,541,167, issued Sep. 17, 1985 and assigned to Texas Instruments Incorporated. Pad oxide 50 is shown at the surface of the structure and illustrates a generic oxide layer. This generic oxide layer may be removed and reformed at various steps throughout the process.

Figure 4C:
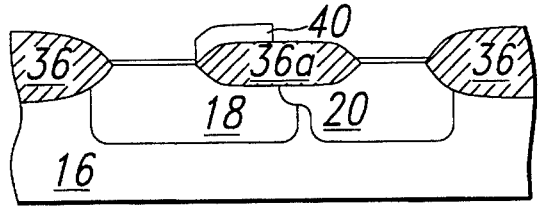

Referring to FIG. 4c, a gate electrode 40 may be formed over a portion of field oxide region 36a. Gate electrode 40 may be formed by depositing, patterning and etching a layer of polysilicon. Gate electrode 40 is separated from extended drain region 20 and p-tank 18 by field oxide layer 36a. Accordingly, there is no thin oxide separating gate electrode 40 from extended drain region 20 as in the prior art.

Figure 4D:
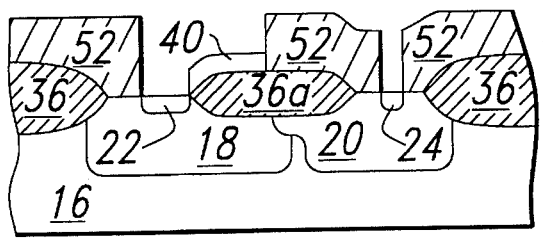
Figure 4E:
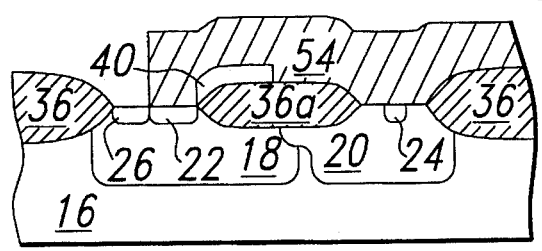

Referring to FIG. 4d, masking layer 52 is formed over the surface of the structure to expose areas where n+ diffused regions 22 and 24 are to be formed. Drain region 24 may alternatively be self aligned to the field oxide regions 36 and 36a. N+ diffused regions 22 and 24 may be formed by implantation and diffusion of an n-type dopant such as phosphorus and/or arsenic. A dopant concentration on the order of $1\times10^{20}/cm^3$ may be used. Masking layer 52 is removed and replaced with masking layer 54 as shown in FIG. 4e. Masking layer 54 exposes those areas of the structure where p+ diffused region 26 is to be formed. P+ diffused region 26 maybe formed by implantation and diffusion of a p-type dopant such as boron. A dopant concentration on the order of $1\times10^{20}/cm^3$ may be used. Masking layer 54 is then removed. It should be noted that a single diffusion step could be used for both the n+ and p+ regions. Finally, the desired interconnections are formed according to methods well known in the art.

Figure 5:
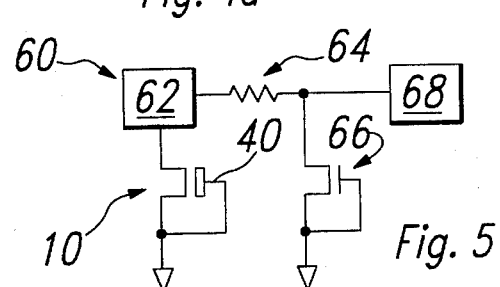
FIG. 5 is a schematic diagram of a protection circuit according to the invention.

A protection circuit 60 according to the invention is shown in FIG. 5. FODENMOS 10 is connected between the bond pad 62 and ground. The gate 40 of DENMOS 10 is connected to ground. A resistor 64 is connected between bond pad 62 and the internal circuitry 68. Resistor 64 may comprise a polysilicon resistor or a n-type diffused region within a tank region such as tank 18. A diffused region formed directly in the substrate 16 may not be able to withstand the voltages required for ESD protection. The value of resistor 64 varies by design and may be on the order of 100 ohms. DENMOS 66 is connected between resistor 64 (on the internal circuitry 68 side) and ground. The gate of DENMOS 66 is also connected to ground. DENMOS 66 may be a conventional DENMOS such as that described above in the Background. The FODENMOS 10, DENMOS 66, and resistor 64 may all be formed in the same tank region. However, separated extended drain regions are provided for FODENMOS 10 and DENMOS 66.

The dimensions of the devices 10, 64, and 66 will vary depending on the application/environment. As an example only, ESD protection for an automotive environment may be accomplished by making FODENMOS 10 on the order of 400 microns wide and 3 to 5 microns long. DENMOS 66 may then be on the order of 200 microns wide and 3 microns in length. Resistor 64 may be on the order of 100 ohms.

During an ESD event, the voltage at bond pad 62 begins to rise. When the voltage reaches the breakdown voltage of DENMOS 66 (e.g., approximately 50 volts), DENMOS 66 triggers protecting the internal circuitry 68. Resistor 64 limits current to the DENMOS 66 and thus prevents damage to the DENMOS 66. In the process, a voltage drop occurs across resistor 64 and the voltage at the bond pad 62 increases to the breakdown voltage of the FODENMOS 10 (e.g., on the order of 60–70 volts). FODENMOS 10 then triggers and dissipates most of the ESD power. FODENMOS 10 is thus the primary protection device.

Figure 6:
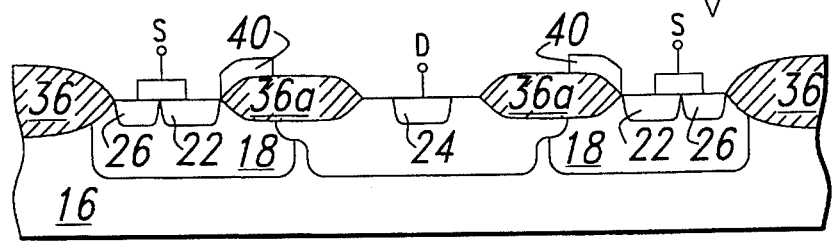
FIG. 6 is a cross-sectional diagram of a drain centered FODENMOS according to an alternate embodiment of the invention.

An alternative embodiment of the invention is shown in FIG. 6. In this embodiment, the drain region 24 and extended drain region 20 are centered in the device. A p-tank 18 is placed on both sides of extended drain region 20. A source region 22 and p-type region 26 are located in each p-tank. A field oxide region 36a extends from each source region to over a portion of the extended drain region 20 and a gate electrode is located over said field oxide region 36a. This embodiment may be formed with the same process described above.

While this invention has been described with reference to illustrative embodiments, this description is not intended to be construed in a limiting sense. Various modifications and combinations of the illustrative embodiments, as well as other embodiments of the invention, such as using a n-type epitaxial layer instead of p-type epitaxial layer and associated changes will be apparent to persons skilled in the art upon reference to the description. It is therefore intended that the appended claims encompass any such modifications or embodiments.

What is claimed is:

1. A protection circuit for protecting internal circuitry, comprising:
    a primary protection device that comprises:
        a source region connected to ground;
        an extended drain well region;
        a drain region within said extended drain well region connected to a bond pad; and
        an oxide layer on the order of 4000 Å thick extending from said source region to over a portion of said extended drain well region;
    a resistor connected between said bond pad and said internal circuitry;
    a drain extended nMOS transistor connected between said resistor and ground.

2. The protection circuit of claim 1 wherein said resistor is on the order of 100 ohms.

3. The protection circuit of claim 1 wherein said drain extended nMOS transistor comprises a gate electrode connected to ground.

4. The protection circuit of claim 1, wherein said primary protection device has trigger voltage on the order of 65 volts and said drain extended nMOs transistor has a breakdown voltage on the order of 50 volts.

5. The protection circuit of claim 1 wherein said primary protection device further comprises a gate electrode separated from said extended drain well region by said oxide layer and connected to ground.

6. The protection circuit of claim 1 wherein said oxide layer is a field oxide layer.

* * * * *